US008188829B2

(12) United States Patent
Nakahori et al.

(10) Patent No.: US 8,188,829 B2
(45) Date of Patent: May 29, 2012

(54) COIL SUBSTRATE STRUCTURE, SUBSTRATE HOLDING STRUCTURE, AND SWITCHING POWER SUPPLY

(75) Inventors: Wataru Nakahori, Tokyo (JP); Masaki Kan, Tokyo (JP); Atsushi Yakuwa, Tokyo (JP)

(73) Assignee: TDK Corporation, Tokyo (JP)

( * ) Notice: Subject to any disclaimer, the term of this patent is extended or adjusted under 35 U.S.C. 154(b) by 84 days.

(21) Appl. No.: 12/640,041

(22) Filed: Dec. 17, 2009

(65) Prior Publication Data
US 2010/0164670 A1  Jul. 1, 2010

(30) Foreign Application Priority Data

Dec. 26, 2008 (JP) .................. 2008-332598
Dec. 26, 2008 (JP) .................. 2008-332611

(51) Int. Cl.
  H01F 5/00   (2006.01)
  H01F 27/28  (2006.01)
  H01F 27/26  (2006.01)
  H01F 27/30  (2006.01)
  H02M 3/00   (2006.01)
  H02M 5/16   (2006.01)

(52) U.S. Cl. ........ 336/200; 336/232; 336/210; 336/196; 336/197; 363/15; 363/171

(58) Field of Classification Search .......... 336/123, 336/131, 182, 184–185, 197, 199, 210, 200, 336/232; 363/15, 20, 34, 171
See application file for complete search history.

(56) References Cited

U.S. PATENT DOCUMENTS
4,622,627 A * 11/1986 Rodriguez et al. ........ 363/37

FOREIGN PATENT DOCUMENTS
| JP | U-1-139494 | 9/1989 |
| JP | A-2003-60143 | 2/2003 |
| JP | A-2003-109830 | 4/2003 |
| JP | A-2005-38872 | 2/2005 |

* cited by examiner

Primary Examiner — Elvin G Enad
Assistant Examiner — Ronald Hinson
(74) Attorney, Agent, or Firm — Oliff & Berridge, PLC

(57) ABSTRACT

A coil substrate structure which enhances heat dissipation and fully secures a mounting area is provided. A coil substrate structure 100 comprises a first coil substrate 110 having a primary transformer coil part 41; a second coil substrate 120, disposed on the first coil substrate 110, having a secondary transformer coil part 42; and a transformer core 130 for magnetically connecting the transformer coil parts 41, 42 to each other. The coil substrates 110, 120 are disposed on each other while being shifted from each other such that the transformer coil parts 41, 42 overlap each other as seen in the substrate thickness direction. This can increase the heat dissipation area of the coil substrates 110, 120. The transformer coil parts 41, 42 have a width in a transmission direction A narrower than a width in a direction B intersecting the transmission direction A as seen in the substrate thickness direction. This can reduce the multilayer area of the coil substrates 110, 120 in the transmission direction A.

14 Claims, 13 Drawing Sheets

*Fig.6*
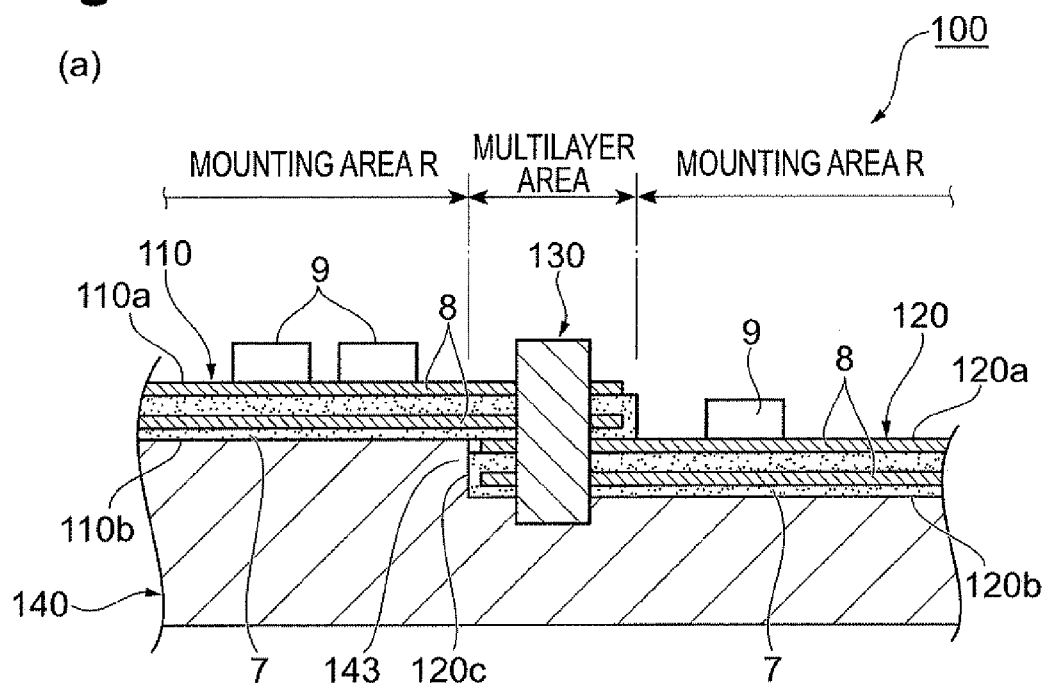
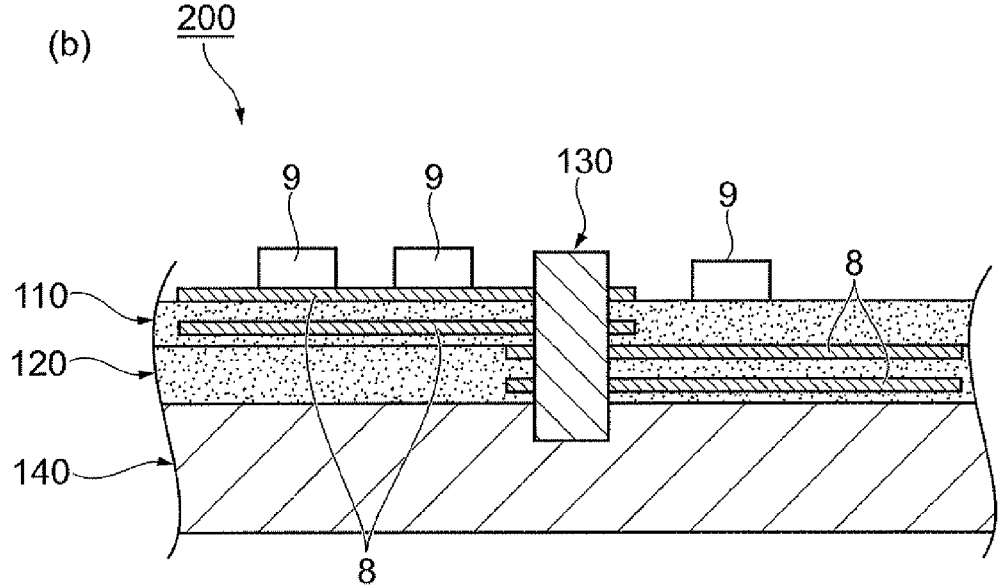

COIL SUBSTRATE STRUCTURE, SUBSTRATE HOLDING STRUCTURE, AND SWITCHING POWER SUPPLY

BACKGROUND OF THE INVENTION

1. Field of the Invention

The present invention relates to a coil substrate structure, a substrate holding structure, and a switching power supply.

2. Related Background Art

Known as a conventional coil substrate structure is one comprising a first coil substrate having a primary transformer coil part, a second coil substrate having a secondary transformer coil part, and a transformer core for magnetically connecting the primary and secondary transformer coil parts to each other (see, for example, Japanese Patent Application Laid-Open No. 2005-38872). The first and second transformer coil parts in such a coil substrate structure are disposed on each other such that the primary and secondary transformer coil parts overlap each other as seen in the substrate thickness direction.

Known as a conventional substrate holding structure is one comprising a circuit substrate, a chassis mounted with the circuit substrate, components mounted on the circuit substrate, and a pressing member for pressing the mounted components to the chassis (see, for example, Japanese Utility Model Application Laid-Open No. 01-139494).

SUMMARY OF THE INVENTION

Meanwhile, it has recently been required for coil substrate structures to enhance their heat dissipation, thereby demanding those which can further dissipate heat from the first and second coil substrates. Coil substrate structures such as those mentioned above have been requested to further reduce their sizes, thus also necessitating those which can fully secure a mounting area (i.e., an area where components can be mounted on the first and second coil substrates) even when made smaller.

It is therefore an object of the present invention to provide a coil substrate structure and a switching power supply which can enhance heat dissipation and fully secure a mounting area.

For achieving the above-mentioned object, the present invention provides a coil substrate structure comprising a first coil substrate having a primary transformer coil part and a second coil substrate, disposed on the first coil substrate, having a secondary transformer coil part; wherein the primary and secondary transformer coil parts include a spirally extending conductor pattern as seen in a substrate thickness direction; wherein the first and second coil substrates are disposed on each other while being shifted from each other such that the primary and secondary transformer coil parts overlap each other as seen in the substrate thickness direction; and wherein the primary and secondary transformer coil parts have a width in a predetermined direction narrower than a width in a direction intersecting the predetermined direction as seen in the substrate thickness direction.

Since the first and second coil substrates are disposed on each other while being shifted from each other, as compared with one in which the first and second coil substrates are superposed on each other, the coil substrate structure of the present invention can enhance their outer surface area, i.e., heat dissipation area. Here, the area where the first and second coil substrates overlap each other is an area where the primary and secondary transformer coil parts overlap each other as seen in the substrate thickness direction, which elongates heat dissipation paths for mounted components and thus makes it difficult to mount components having a large amount of heat generation onto this area. In this regard, the primary and secondary transformer coil parts have a narrower width in a predetermined direction as seen in the substrate thickness direction in the present invention, so that the area where the first and second coil substrates overlap each other is reduced in the predetermined direction. Therefore, the mounting area can fully be secured even when the coil substrate structure is made smaller, for example. Hence, the present invention can enhance heat dissipation and fully secure the mounting area.

Preferably, the coil substrate structure is one which transmits electric power from the first coil substrate side to the second coil substrate side, while the predetermined direction is a direction extending along the electric power transmitting direction. This shortens the power transmission length in the coil substrate structure, thereby making it possible to reduce the power loss of the coil substrate structure.

The conductor pattern may have a conductor width in the predetermined direction narrower than that in the intersecting direction.

Preferably, the first and second coil substrates have a first main face mounted with a component and a second main face, opposite to the first main face, in contact with a heat dissipating member. In this case, the heat of the component mounted on the first main face is transferred to the heat dissipating member and dissipated by the heat dissipating member. This can dissipate the heat of the mounted member more and further enhance the heat dissipation.

Here, it will be preferred if the first and second coil substrates are disposed on each other such that one having a higher amount of heat generation is positioned closer to the heat dissipating member. As illustrated in FIG. 6(a), for example, one coil substrate 120 positioned closer to a heatsink 140 can attain a greater contact area with the heatsink 140 as compared with the other coil substrate 110. Therefore, the heat of the coil substrate structure 100 can effectively be dissipated when the coil substrate 120 having a large amount of heat generation is disposed on the other so as to be positioned closer to the heatsink 140.

A specific structure which favorably exhibits the advantageous effect mentioned above is one in which the first and second coil substrates have an elongated planar form and are disposed on each other while being longitudinally shifted from each other, the primary and secondary transformer coil parts have a width in a longitudinal direction as the predetermined direction narrower than a width in a lateral direction as the intersecting direction as seen in the substrate thickness direction.

The coil substrate structure may further comprise a transformer core for magnetically connecting the primary and secondary transformer coil parts to each other, each of the primary and secondary transformer coil parts having a through hole for inserting the transformer core, the conductor pattern extending spirally about the through hole.

The present invention provides a switching power supply comprising the above-mentioned coil substrate structure. This switching power supply also yields the above-mentioned effect of enhancing heat dissipation and fully securing the mounting area. Examples of the switching power supply include DC to DC and AC to DC converters.

In the substrate holding structure mentioned above, the circuit substrate is typically secured to the chassis with a fastening device such as a screw, whereby such a stress as to flex the circuit substrate may occur upon fastening. This makes it easier for the circuit substrate to incur warpage and flexure, whereby the contact between the circuit substrate and chassis may decrease. When secured by a fastening device such as a screw, the circuit substrate is likely to incur warpage and flexure due to changes in temperature because of the difference between coefficients of thermal expansion of the circuit substrate and chassis, which may also lower the adhesion between the circuit substrate and chassis.

It has recently been demanded for coil substrate structures to further reduce their sizes. Such a demand has also called for those which can fully secure a mounting area (i.e., an area where components can be mounted on the circuit substrates) even when made smaller, for example.

It is therefore another object of the present invention to provide a substrate holding structure and a switching power supply which can improve the adhesion between the circuit substrate and chassis while securing the mounting area.

For achieving this object, the present invention provides a substrate holding structure, equipped with a circuit substrate constituting a predetermined circuit, for holding the circuit substrate; the substrate holding structure comprising a chassis mounted with the circuit substrate, a component mounted to the circuit substrate, a pressing member for pressing the mounted component to the chassis, and a through member constituting the predetermined circuit and engaging the chassis while penetrating through the circuit substrate; wherein the circuit substrate is inhibited from shifting along a main face thereof by the through member alone.

In this substrate holding structure, the pressing member presses the mounted component, whereby the circuit substrate is pressed in its thickness direction against the chassis. The through member penetrates through the circuit substrate, while the circuit substrate is inhibited from shifting along the main face thereof (hereinafter simply referred to as "shifting") by the through member alone. Therefore, the circuit substrate is secured to the chassis while being allowed to shift by a gap with the through member. Hence, the stress generated in the circuit substrate can be released, so as to prevent the warp and flexure from occurring, whereby the adhesion between the circuit substrate and chassis can be enhanced. This can inhibit the circuit substrate from vibrating and favorably transfer the heat from the circuit substrate to the chassis. Since the through member constitutes the predetermined circuit, it is not necessary to provide a fastening device such as a screw or pin separately at the time of securing the circuit substrate, whereby the mounting area can be kept from being reduced by such a fastening device. As a result, the present invention can enhance the adhesion between the circuit substrate and chassis while securing the mounting area.

A specific structure which favorably yields the advantageous effect mentioned above is one in which the through member penetrates through the circuit substrate with a predetermined amount of gap. The circuit substrate may comprise a first coil substrate having a primary transformer coil part and a second coil substrate, disposed on the first coil substrate, having a secondary transformer coil part, and the through member may be a transformer core for magnetically connecting the primary and secondary transformer coil parts to each other.

Here, it will be preferred if the first and second coil substrates are disposed on each other while being shifted from each other such that the primary and secondary transformer coil parts overlap each other as seen in the substrate thickness direction. This can increase the outer surface area of the first and second coil substrates, i.e., heat dissipation area, and enhance heat dissipation as compared with one in which the first and second coil substrates are superposed on each other.

Preferably, the chassis is a heat dissipating member for dissipating the heat from the circuit substrate. In this case, since the adhesion between the circuit substrate and chassis is enhanced by the above-mentioned effect, the heat of the mounted component can be transferred more to the heat dissipating member through the first and second coil substrates. Hence, the heat dissipation can further be improved.

The present invention also provides a switching power supply comprising the above-mentioned substrate holding structure. This switching power supply also yields the above-mentioned effect of improving the adhesion between the circuit substrate and chassis while securing the mounting area. Examples of the switching power supply include DC to DC and AC to DC converters.

The present invention provides a coil substrate structure including a first coil substrate constituting a predetermined circuit and having a primary transformer coil part and a second coil substrate, disposed on the first coil substrate, constituting the predetermined circuit and having a secondary transformer coil part; the coil substrate structure comprising a chassis mounted with the first and second coil substrates, a component mounted on the first and second coil substrates, a pressing member for pressing the mounted component to the chassis, and a through member constituting the predetermined circuit and engaging the chassis while penetrating through the first and second coil substrates; wherein the first and second coil substrates are inhibited from shifting along a main face thereof by the through member alone; wherein the primary and secondary transformer coil parts include a spirally extending conductor pattern as seen in a substrate thickness direction; wherein the first and second coil substrates are disposed on each other while being shifted from each other such that the primary and secondary transformer coil parts overlap each other as seen in the substrate thickness direction; and wherein the primary and secondary transformer coil parts have a width in a predetermined direction narrower than a width in a direction intersecting the predetermined direction as seen in the substrate thickness direction.

The present invention also provides a switching power supply comprising the above-mentioned coil substrate structure.

BRIEF DESCRIPTION OF THE DRAWINGS

FIG. 6(*a*) is a schematic view of a cross section taken along the line VI-VI of FIG. 2, while FIG. 6(*b*) is a schematic view, corresponding to FIG. 6(*a*), of a conventional coil substrate structure;

DESCRIPTION OF THE PREFERRED EMBODIMENTS

In the following, preferred embodiments of the present invention will be explained in detail with reference to the accompanying drawings. In the following explanations, identical or equivalent constituents will be referred to with the same reference signs while omitting their overlapping descriptions.

First Embodiment

Figure 1:
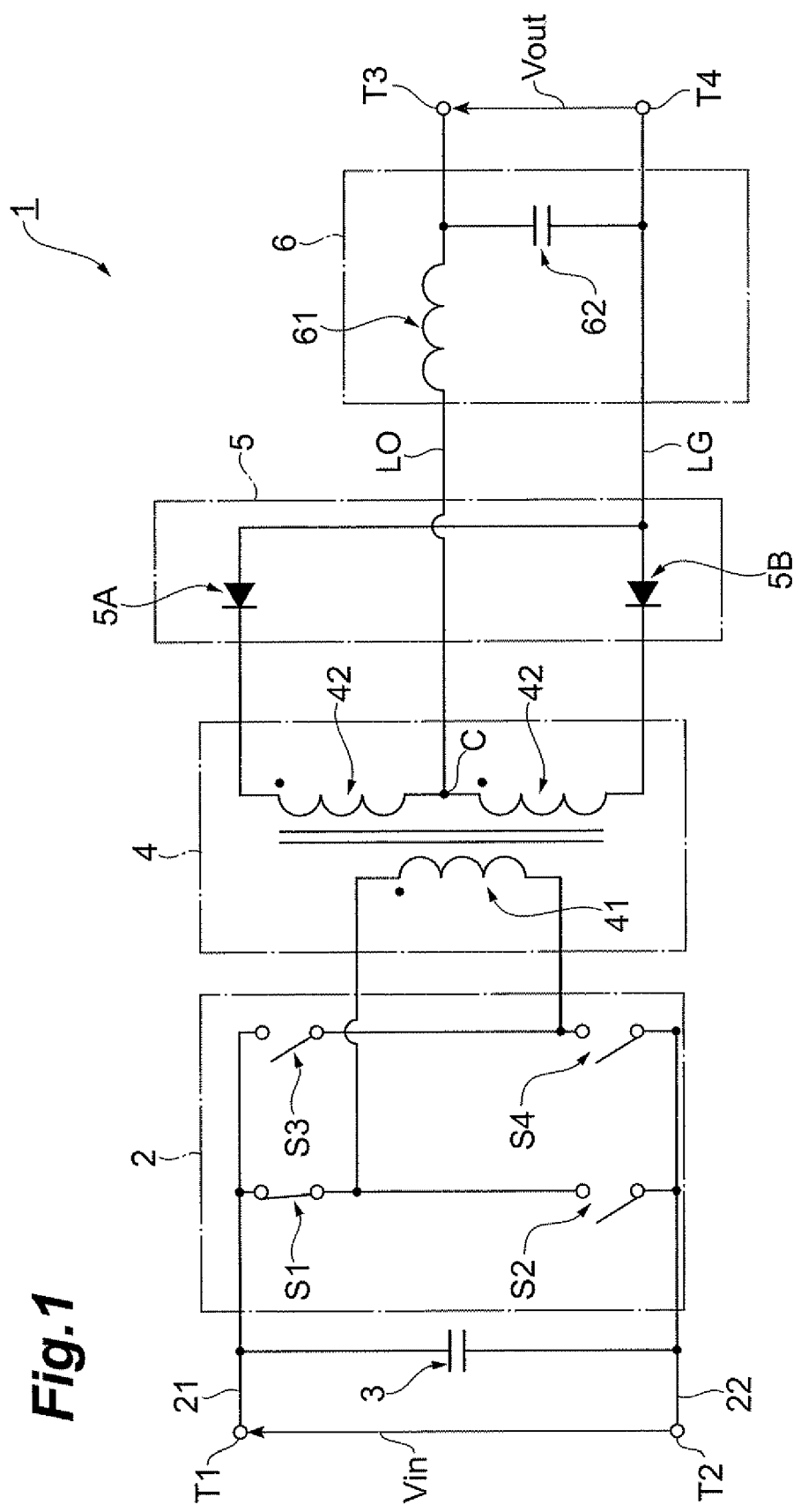
FIG. 1 is a circuit diagram of the switching power supply in accordance with a first embodiment of the present invention.

FIG. 1 is a circuit diagram of the switching power supply in accordance with the first embodiment of the present invention. As illustrated in FIG. 1, the switching power supply 1 in accordance with this embodiment, which functions as a DC to DC converter, converts a higher DC input voltage Vin supplied from a higher voltage battery or the like into a lower DC output voltage Vout and feeds the latter to a lower voltage battery or the like.

The switching power supply 1 comprises a switching circuit 2 and an input smoothing capacitor 3 which are disposed between a primary higher voltage line 21 and a primary lower voltage line 22, a transformer 4 having primary and secondary transformer coil parts 41, 42, a rectifier circuit 5 connected to the secondary transformer coil part 42, and a smoothing circuit 6 connected to the rectifier circuit 5.

The switching circuit 2 has a full-bridge circuit structure constituted by switching devices S1 to S4. In response to a driving signal supplied from a driving circuit (not shown), for example, the switching circuit 2 converts the DC input voltage Vin applied between input terminals T1, T2 into an input AC voltage.

The input smoothing capacitor 3 smoothens the DC input voltage Vin fed from the input terminals T1, T2. The transformer 4 transforms the input AC voltage generated by the switching circuit 2 and outputs the resulting AC voltage. The turn ratio between the primary and secondary transformer coil parts 41, 42 is appropriately set according to a voltage transformation ratio. Here, the turn ratio is 3:1, whereby electric power of [3 V, 1 A] is transformed into that of [1 V, 3 A], for example. The secondary transformer coil part 42, which is of a center tap type, is guided to an output terminal T3 through a junction C and an output line LO.

The rectifier circuit 5 is of a single-phase full-wave rectification type constituted by rectifier diodes 5A, 5B. Each of the rectifier diodes 5A, 5B has a cathode connected to the secondary transformer coil part 42 and an anode connected to a grounding line LG led to an output terminal T4. As a consequence, the rectifier circuit 5 individually rectifies half-wave periods of the output AC voltage from the transformer 4, so as to generate a DC voltage.

The smoothing circuit 6 includes a choke coil 61 and an output smoothing capacitor 62. The choke coil 61 is inserted in the output line LO. The output smoothing capacitor 62 is connected between the choke coil 61 in the output line LO and the grounding line LG. As a consequence, the smoothing circuit 6 smoothens the DC voltage rectified by the rectifier circuit 5, so as to generate the DC output voltage Vout, and feeds the latter to a lower voltage battery or the like from the output terminals T3, T4.

The coil substrate structure constituting the circuit mentioned above will now be explained in detail.

Figure 2:
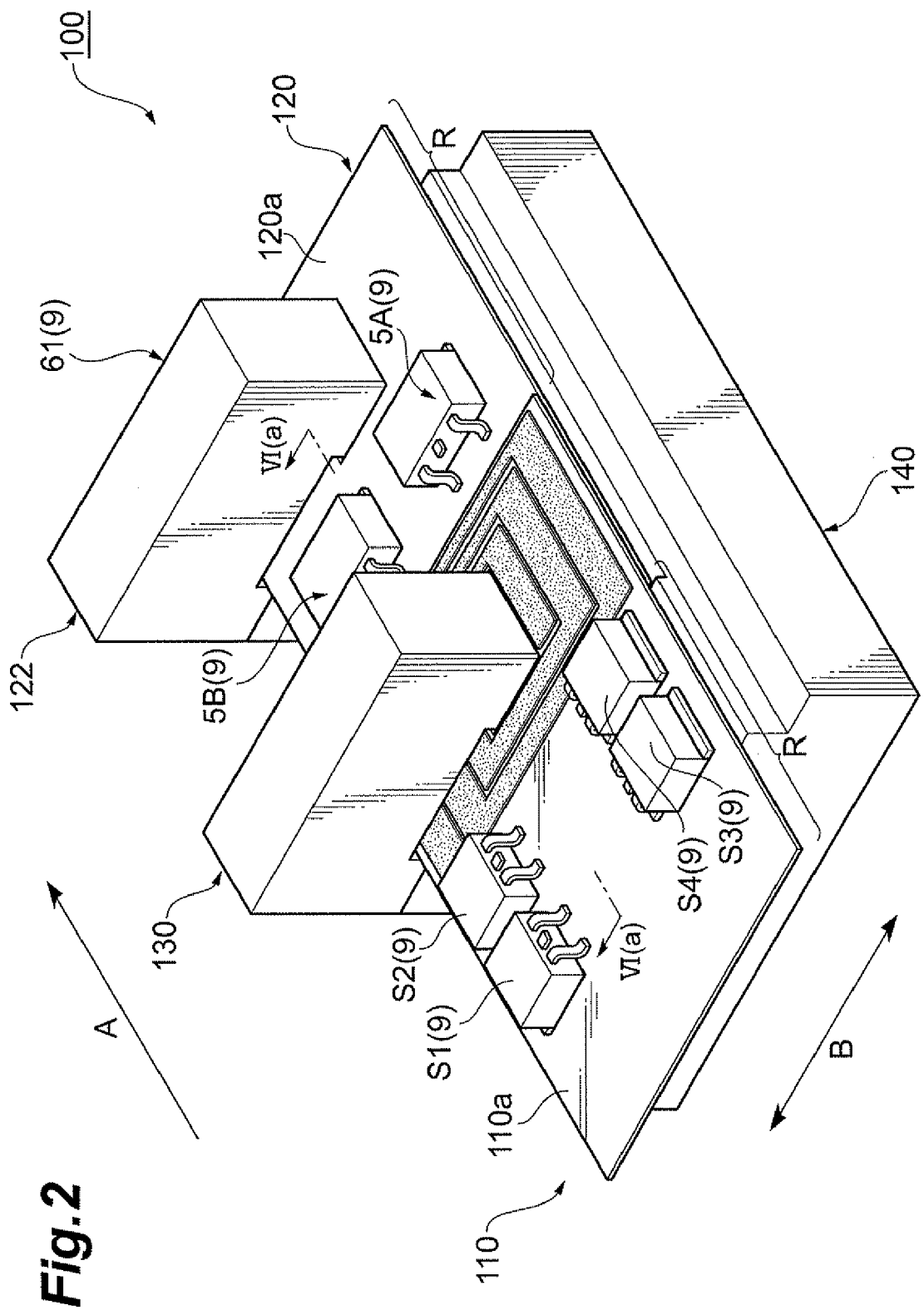
FIG. 2 is a perspective view illustrating a main part of a coil substrate structure in the switching power supply of FIG. 1.
Figure 3:
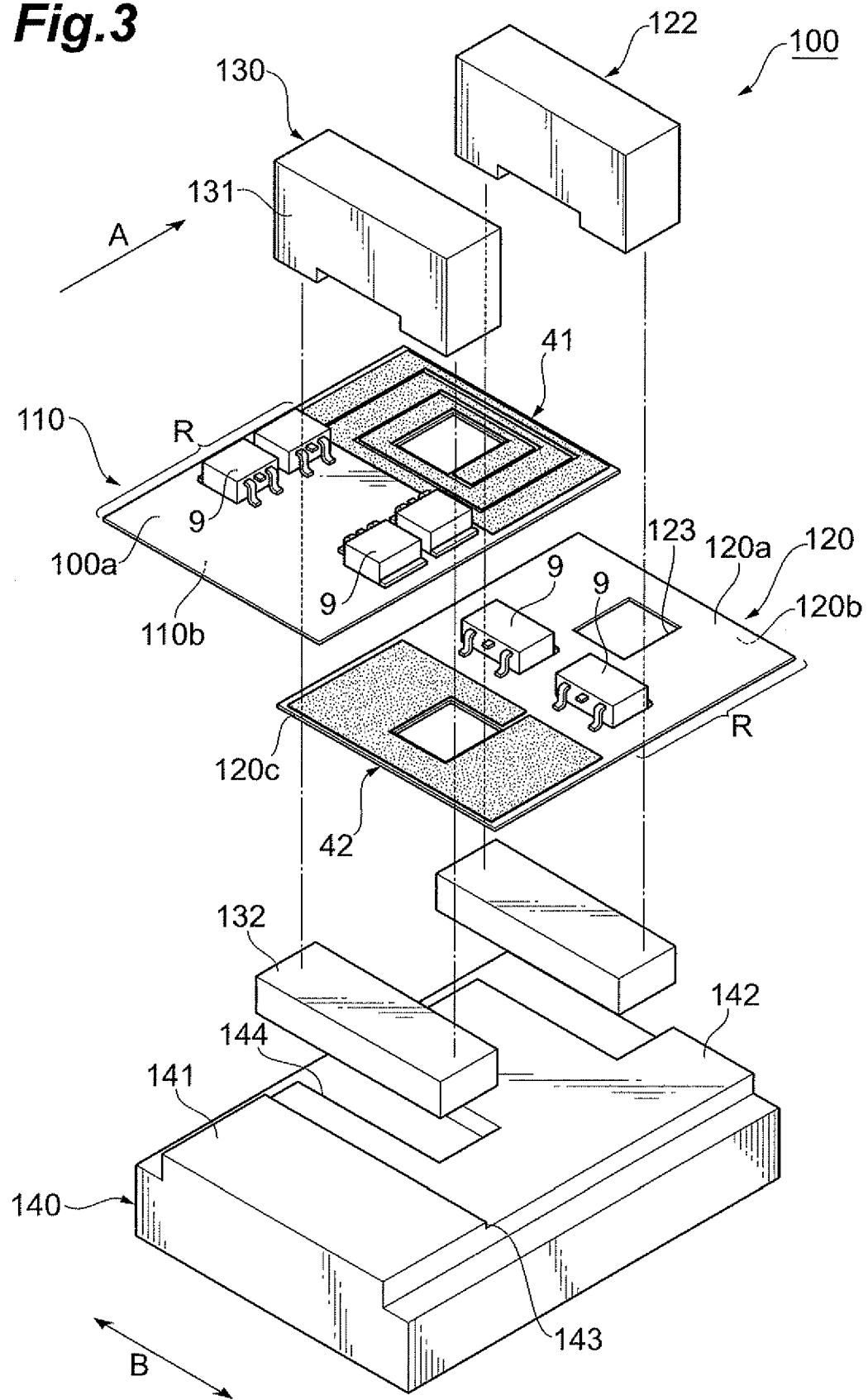
FIG. 3 is an exploded perspective view of the coil substrate structure of FIG. 2.

FIG. 2 is a perspective view illustrating a main part of the coil substrate structure in the switching power supply of FIG. 1, while FIG. 3 is an exploded perspective view of the coil substrate structure of FIG. 2. As illustrated in FIGS. 2 and 3, the coil substrate structure 100 of this embodiment comprises first and second coil substrates 110, 120 disposed on (overlapped with) each other while being shifted from each other, a transformer core 130, and a heatsink (heat dissipating member) 140.

This coil substrate structure 100 transmits (transforms) electric power along a transmission direction (transformation direction) A from the first coil substrate 110 side to the second coil substrate 120 side. That is, the transmission direction (transformation direction) A is a vector direction in which electric power is transmitted in the coil substrate structure 100.

Each of the first and second coil substrates 110, 120 is a planar printed board whose longitudinal direction lies in the transmission direction A. Each of the first and second coil substrates 110, 120 is a multilayer substrate including a resin layer (base) 7 and a plurality of metal layers 8 (two layers consisting of upper and inner layers here) made of copper or the like (see FIG. 6). The metal layers 8, which are conductor forming layers, construct conductor patterns 44, 46 which will be explained later and wiring conductors for connecting them to mounted components 9. Undepicted interlayer junctions are disposed between the metal layers 8. Necessary parts of upper faces (first main faces) 110a, 120a of the first and second coil substrates 110, 120 are covered with a resist (not shown).

Figure 4:
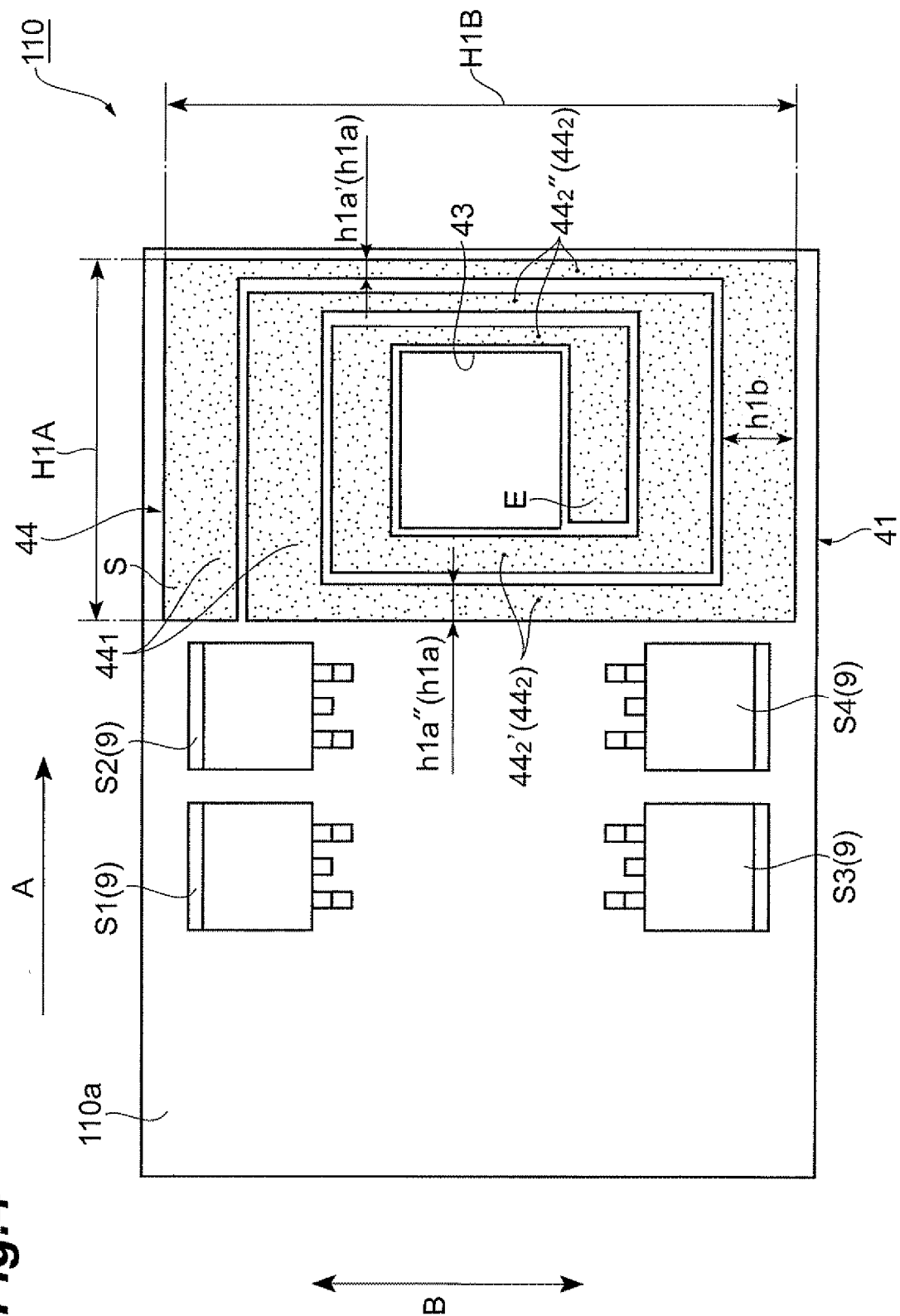
FIG. 4 is a top plan view illustrating the first coil substrate of FIG. 2.

FIG. 4 is a top plan view illustrating the first coil substrate of FIG. 2. As illustrated in FIG. 4, the first coil substrate 110 is provided with the primary transformer coil part 41 in an area extending from substantially the center thereof in the transmission direction A to the downstream side as seen in the substrate thickness direction (laminating direction; from the upper face 110a side). At substantially the center position of the primary transformer coil part 41, a rectangular through hole 43 is formed as one through which the transformer core 130 is inserted. The primary transformer coil part 41 is provided with a conductor pattern 44 extending like a rectangular spiral about the through hole 43.

The conductor pattern 44 is a coil pattern formed by copper or the like, for example, on the upper face 110a side of the first coil substrate 110. The conductor pattern 44 is constructed such that conductor patterns $44_1$ extending along the transmission direction A and conductor patterns $44_2$ extending along an intersecting direction B continue with each other.

The conductor pattern 44 has a conductor width h1$a$ in the transmission direction A narrower than a conductor width h1$b$ in the direction B (hereinafter referred to as "intersecting direction B") intersecting (herein orthogonal to) the transmission direction A. This makes the primary transformer coil part 41 have a width H1A in the transmission direction (predetermined direction) A narrower than a width H1B in the intersecting direction B as seen in the substrate thickness direction. In other words, in the primary transformer coil part 41, the longitudinal width H1A of the first coil substrate 110 is narrower than the lateral width H1B thereof.

The conductor pattern 44 has a start edge S and an end edge E which are appropriately configured from a manufacturing viewpoint, for example. In the illustrated example, on the upper face 110a seen in the substrate thickness direction, an end portion of the conductor pattern $44_1$ located on the depicted upper side is the start edge S, while an end portion of the conductor pattern $44_1$ located on the depicted lower side of the through hole 43 is the end edge E. Therefore, the number of conductor patterns $44_2''$ in the area on the downstream side of the transmission direction A is greater than the number of conductor patterns $44_2'$ in the area on the upstream side of the transmission direction A, while the conductor patterns $44_2''$ have a conductor width h1a" narrower than a conductor width h1a' of the conductor patterns $44_2'$.

The start edge S is connected to the switching devices S1, S2 of the switching circuit 2 through a conductor formed by the inner metal layer 8 in the first coil substrate 110. The end edge E is connected to the switching devices S3, S4 of the switching circuit 2 through a conductor formed by the inner metal layer 8 in the first coil substrate 110.

Figure 5:
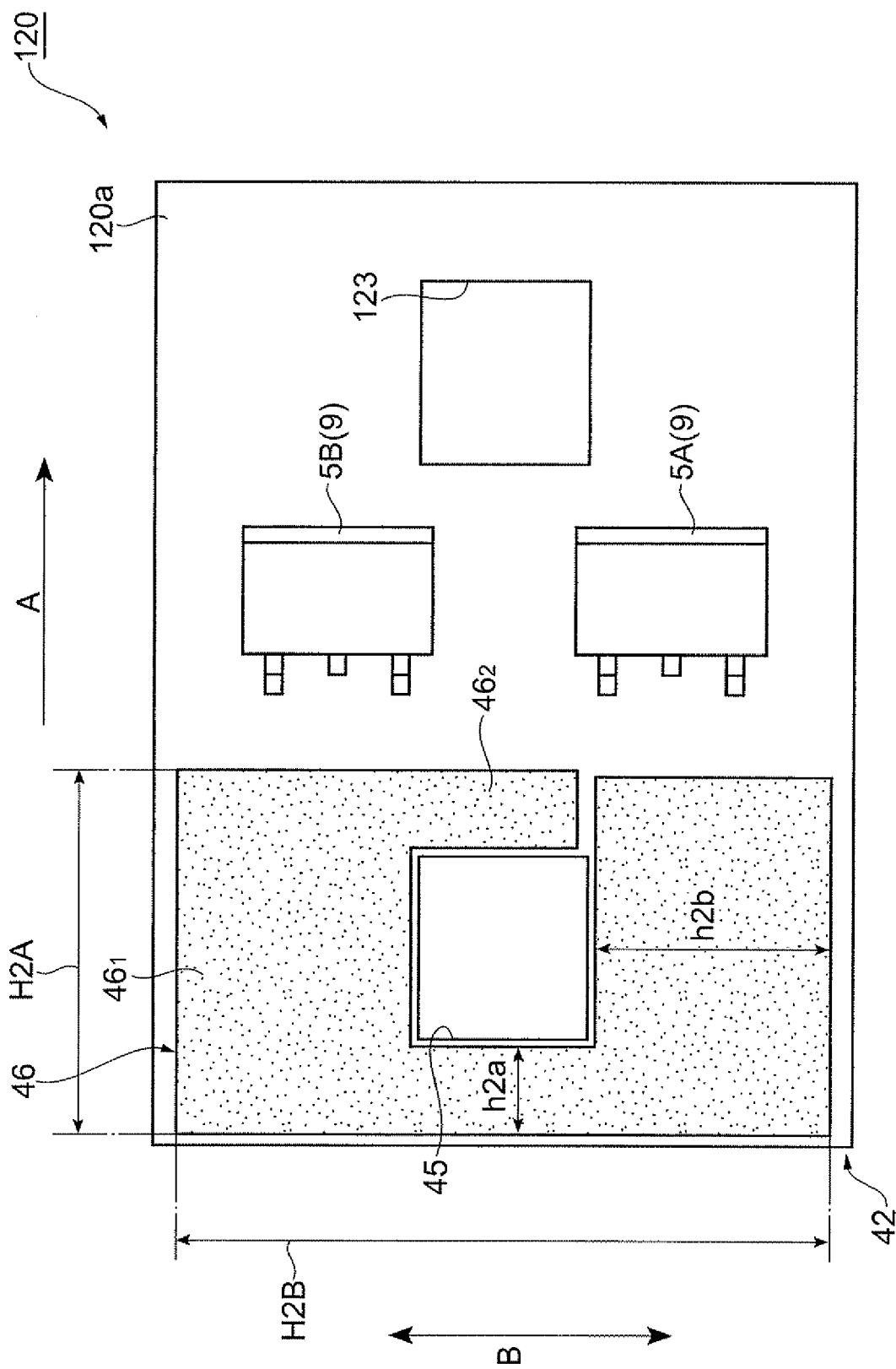
FIG. 5 is a top plan view illustrating the second coil substrate of FIG. 2.

FIG. 5 is a top plan view illustrating the second coil substrate of FIG. 2. As illustrated in FIG. 5, the second coil substrate 120 is provided with the secondary transformer coil part 42 in an area extending from the upstream side of the transmission direction A to substantially the center thereof as seen in the substrate thickness direction. At substantially the center position of the secondary transformer coil part 42, a rectangular through hole 45 is formed as one through which the transformer core 130 is inserted. The secondary transformer coil part 42 is provided with a conductor pattern 46 extending like a rectangular spiral about the through hole 45.

The conductor pattern 46 is a coil pattern formed by copper or the like on the upper face 120a side of the second coil substrate 120. The conductor pattern 46 is constructed such that conductor patterns $46_1$ extending along the transmission direction A and conductor patterns $46_2$ extending along the intersecting direction B continue with each other.

As in the primary transformer coil part 41, the conductor pattern 46 has a conductor width h2a in the transmission direction A narrower than a conductor width h2b in the intersecting direction B. This makes the secondary transformer coil part 42 have a width H2A in the transmission direction A narrower than a width H2B in the intersecting direction B as seen in the substrate thickness direction. In other words, the longitudinal width H2A of the secondary coil substrate 120 is narrower than the lateral width H2B thereof in the secondary transformer coil part 42 as well.

Returning to FIGS. 2 and 3, the first and second coil substrates 110, 120 are disposed on each other while being shifted from each other in the transmission direction A such that only the primary and secondary transformer coil parts 41, 42 overlap each other as seen in the substrate thickness direction (i.e., only the primary and secondary transformer coil parts 41, 42 become a multilayer area) and that the through holes 43, 45 communicate with each other. Here, the second coil substrate 120 is disposed on the heatsink 140 side (lower side).

On the upper faces 110a, 120a of the first and second coil substrates 110, 120, areas other than the multilayer area are employed as mounting areas R mounted with components 9 such as semiconductor components. Specifically, as illustrated in FIG. 2, the switching devices S1 to S4 are mounted on the mounting area R of the first coil substrate 110, while the rectifier diodes 5A, 5B are mounted on the mounting area R of the second coil substrate 120.

Examples of the switching devices include metal-oxide-semiconductor field-effect transistors (MOS-FET) and insulated gate bipolar transistors (IGBT).

The second coil substrate 120 has at least a core 122 formed from a magnetic material such as ferrite, for example, as one corresponding to the choke coil 61. The core 122 is inserted in the rectangular through hole 123 (see FIG. 5) formed in the second coil substrate 120 at the downstream end part of the transmission direction A.

The transformer core 130 is used for magnetically connecting the primary and secondary transformer coil parts 41, 42 to each other and constitutes the transformer 4. The transformer core 130 is formed from a magnetic material such as ferrite, for example. As illustrated in FIG. 3, the transformer core 130 includes an upper core 131 which is a so-called U-shaped core and a lower core 132 which is a so-called I-shaped core, while they are joined and secured to each other by a securing member which is not shown.

The upper core 131 of the transformer core 130 is inserted in the through holes 43, 45. The transformer core 130 is attached to the first and second coil substrates 110, 120 such that the cores 131, 132 cover a part of the primary and secondary transformer coil parts 41, 42.

The heatsink 140 is one for dissipating the heat of the first and second coil substrates 110, 120 and releasing the heat of the mounted components 9 through the first and second coil substrates 110, 120. The heatsink 140 is formed from aluminum, for example, and has a coefficient of thermal conductivity higher than that of the first and second coil substrates 110, 120.

The heatsink 140 has a heat dissipating surface 141 for abutting against the lower face (second main face) 110b of the first coil substrate 110 and a heat dissipating surface 142 for abutting against the lower face (second main face) 120b of the second coil substrate 120. The heat dissipating surfaces 141, 142 are constructed such as to continue with each other through a step 143 having a height equal to the thickness of the second coil substrate 120. The heat dissipating surface 142 is formed with a depression 144 which is depressed in conformity to the form of the lower core 132 in order to catch the latter.

In the heatsink 140, the first and second coil substrates 110, 120 are mounted on the respective heat dissipating surfaces 141, 142 such that the lower core 132 is placed in the depression 144. Hence, the lower faces 110b, 120b of the first and second coil substrates 110, 120 abut against the heatsink 140 as illustrated in FIG. 6(a).

Specifically, not only areas corresponding to the mounting areas R in the lower faces 110b, 120b of the first and second coil substrates 110, 120 abut against the heat dissipating surfaces 141, 142, respectively, an area not covered with the transformer core 130 in the multilayer area of the lower face 120b of the second coil substrate 120 also abuts against the heat dissipating surface 142. This allows a part of the secondary transformer coil part 42 to thermally abut against the heatsink 140, whereby the heat dissipating area (the contact area with the heatsink 140) can further be enhanced. Here, the side face 120c of the second coil substrate 120 on the upstream side of the transmission direction A is close to or in contact with the step 143.

In thus constructed switching power supply 1, the DC input voltage Yin supplied from the input terminals T1, T2 is subjected to switching, so as to generate an input AC voltage, which is then fed to the primary transformer coil part 41 of the transformer 4. Thus generated input AC voltage is transformed into an output AC voltage, which is then issued from the secondary transformer coil part 42. The output AC voltage is rectified by the rectifier circuit 5 and smoothened by the smoothing circuit 6, so as to be issued as a DC output voltage Vout from the output terminals T3, T4.

As in the foregoing, the first and second coil substrates 110, 120 are disposed on each other while being shifted from each other. Therefore, the heat dissipating surfaces (outer surfaces) of the first and second coil substrates 110, 120 can attain a greater area than in a conventional substrate structure (hereinafter referred to as "conventional substrate structure"; see FIG. 6(b)) 200 in which the first and second coil substrates 110, 120 are superposed on each other. As a result, the heat dissipation of the coil substrate structure 100 can be enhanced.

Since the first and second coil substrates 110, 120 do not overlap each other in the mounting areas R, the following effects are obtained as compared with the conventional substrate structure 200. When propagating heat from the mounted components 9 to the heatsink 140 through the first and second coil substrates 110, 120, the mounted components 9 have shorter heat dissipation paths, whereby the thermal resistance caused by the first and second coil substrates 110, 120 can be reduced, so as to further enhance the heat dissipation. Also, the first and second coil substrates 100, 120 can be formed thinner, so as to cut cost down.

Here, the multilayer area is an area where the primary and secondary transformer coil parts 41, 42 overlap each other as seen in the substrate thickness direction, which elongates heat dissipation paths for the mounted components 9 and thus makes it difficult to mount components 9 having a large amount of heat generation onto the multilayer area. In this regard, as mentioned above, the primary and secondary transformer coil parts 41, 42 in this embodiment have narrower widths H1A, H2A in the transmission direction A as seen in the substrate thickness direction. Hence, the multilayer area is reduced in the transmission direction A in this embodiment. As a result, the mounting areas R can fully be secured, while reducing the size of the coil substrate structure 100 in the transmission direction A. In other words, the mounting areas R can sufficiently be attained without increasing the outer sizes of the first and second coil substrates 110, 120.

This embodiment can fully secure both the heat dissipation area and mounting areas R as in the foregoing, and thus is considered to be one which is small in size and excellent in heat dissipation, while being able to cut cost down. As the number of metal layers 8 included in the first and second coil substrates 110, 120 increases, the number of resin layers 7 interposed between the metal layers 8 becomes greater, so that the thermal resistance of the first and second coil substrates 110, 120, which is the thermal resistance from the mounted components 9 to the heatsink 140, becomes higher, whereby the above-mentioned effect of reducing the thermal resistance becomes remarkable in coil substrates including a large number of metal layers.

The coil substrate structure 100 in accordance with this embodiment is made smaller in the transmission direction A as mentioned above and thus decreases its power transmission length as well, thereby making it possible to reduce its power loss.

As mentioned above, the heatsink 140 directly abuts against both the lower faces 110b, 120b of the first and second coil substrates 110, 120 in this embodiment. This makes it possible to transfer heat from the mounted components 9 through the first and second coil substrates 110, 120 to the heatsink 140 and release it from the latter, whereby the heat of the mounted components 9 can further be dissipated.

Meanwhile, the current value flowing through the secondary transformer coil part 42 is greater than the current value flowing through the primary transformer coil part 41 in this embodiment, whereby the amount of heat generated by the second coil substrate 120 having the secondary transformer coil part 42 is greater than that generated by the first coil substrate 110 having the primary transformer coil part 41.

In this regard in this embodiment, the first and second coil substrates 110, 120 are disposed on each other such that the second coil substrate 120 is located on the heatsink 140 side, while a part of the multilayer area of the lower face 120b of the second coil substrate 120 abuts against the heatsink 140. This can make the contact area between the heatsink 140 and second coil substrate 120 greater than that between the heatsink 140 and first coil substrate 110, thereby releasing heat more from the second substrate 120 and effectively dissipating heat from the coil substrate structure 100.

As mentioned above, the side face 120c of the second coil substrate 120 is close to or in contact with the step 143 in this embodiment, so that a heat dissipation path from the side face 120c can be secured, whereby the heat dissipation can further be improved. Since the transformer 4 is constructed by vertically overlaying the primary and secondary transformer coil parts 41, 42, leakage inductance is lower in this embodiment.

The numbers of turns are 3 and 1 in the primary transformer coil part 41 and secondary transformer coil part 42, respectively, in this embodiment but are not restricted thereto. The conductor patterns 44, 46 may be formed in a plurality of layers including not only the upper metal layers 8 but also the inner metal layers 8. For example, the number of turns of the first coil substrate 110 can become 6 when the inner metal layer 8 on the first coil substrate 110 side is formed with a conductor pattern whose number of turns is 3. When the transformer coil parts 41, 42 are made narrower in the transmission direction (predetermined direction) A than in the intersecting direction B, a greater number of turns can also be obtained in the inner metal layers 8 without increasing the area of the transformer coil parts 41, 42.

In this embodiment, a higher DC voltage is fed from a terminal electrode (not depicted) located on an end part side opposite to the multilayer area in the first coil substrate 110, and a lower DC voltage is issued from a terminal electrode (not depicted) located on an end part side opposite to the multilayer area in the second coil substrate 120. Hence, the transmission direction A here extends from the area of the first coil substrate 110 provided with the switching devices S1 to S4 through the primary and secondary transformer coil parts 41, 42 to the area of the second coil substrates 120 provided with the rectifier diodes 5A, 5B.

Though a preferred embodiment of the present invention is explained in the foregoing, the present invention is not limited thereto. For example, the through holes 43, 45 are formed at substantially the center positions in the primary and secondary transformer coil parts 41, 42 in the above-mentioned embodiment, but may be at various positions in the primary and secondary transformer coil parts 41, 42 as long as functions of the transformer 4 can be exhibited.

Figure 7:
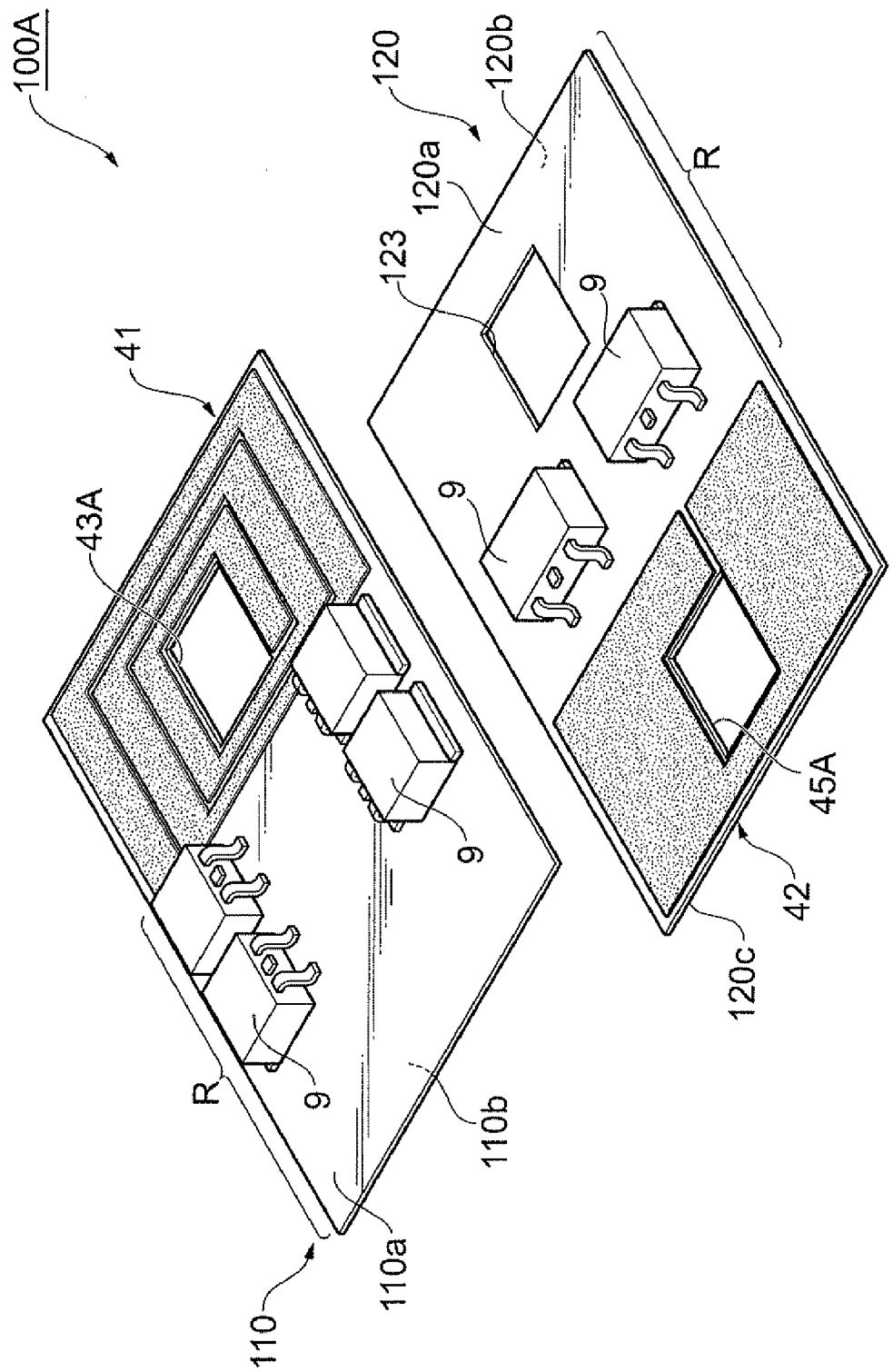
FIG. 7 is an exploded perspective view of a coil substrate structure in the switching power supply in accordance with a modified example.

For example, as illustrated in FIG. 7, the through holes 43A, 45A may be formed on the upstream side of the transmission direction A in the primary and secondary transformer coil parts 41, 42. In the primary and secondary transformer coil parts 41, 42 of this coil substrate structure 100A, the area on the downstream side of the transmission direction A increases in the through holes 43A, 45A, whereby the conductor widths $h1a''$ and $h1a'$ can be made similar to each other even when the number of conductor patterns $44_2''$ is greater than that of conductor patterns $44_2'$.

Though the transformer core 130 in the above-mentioned embodiment uses a U-shaped core as the upper core 131 and an I-shaped core as the lower core 132, an E-shaped core may be used as the upper core, and an I-shaped core or E-shaped core may be used as the lower core. Though the widths H1A, H2A of the transformer coil parts 41, 42 in the transmission direction A are made narrower in the above-mentioned embodiment, such widths may lie in various directions without being restricted to the transmission direction A.

The switching power supply 1 may be any of AC to DC converters and the like without being restricted to the DC to DC converter. The above-mentioned circuit of the switching power supply 1 is of a common-anode center tap type in this embodiment, but may be a common-cathode center tap type, for example. The height of the step 143 is equal to the thickness of the second coil substrate 120 in the above-mentioned embodiment, but may be greater (thicker) than the latter.

Though multilayer substrates are used as the first and second coil substrates 110, 120 in the above-mentioned embodiment, single-layer substrates may be employed. The first and second coil substrates 110, 120 may have widths different from each other.

The first and second coil substrates 110, 120 disposed (laminated) on each other in the above-mentioned embodiment include those in states where they are in contact with each other, they are not in contact with each other, and they are arranged such as to overlap each other.

While power semiconductor devices such as the switching devices S1 to S4 and rectifier diodes 5A, 5B are surface-mounted as the mounted components 9 on the upper faces 110a, 120a of the first and second coil substrates 110, 120 in the above-mentioned embodiment, surface-mount passive devices such as coils and capacitors, for example, may be surface-mounted together with the power semiconductor devices. In this case, it will be sufficient if at least parts of the lower faces 110b, 120b of the first and second coil substrates 110, 120 corresponding to the parts mounted with the power semiconductor devices abut against the heatsink 140.

Second Embodiment

Figure 8:
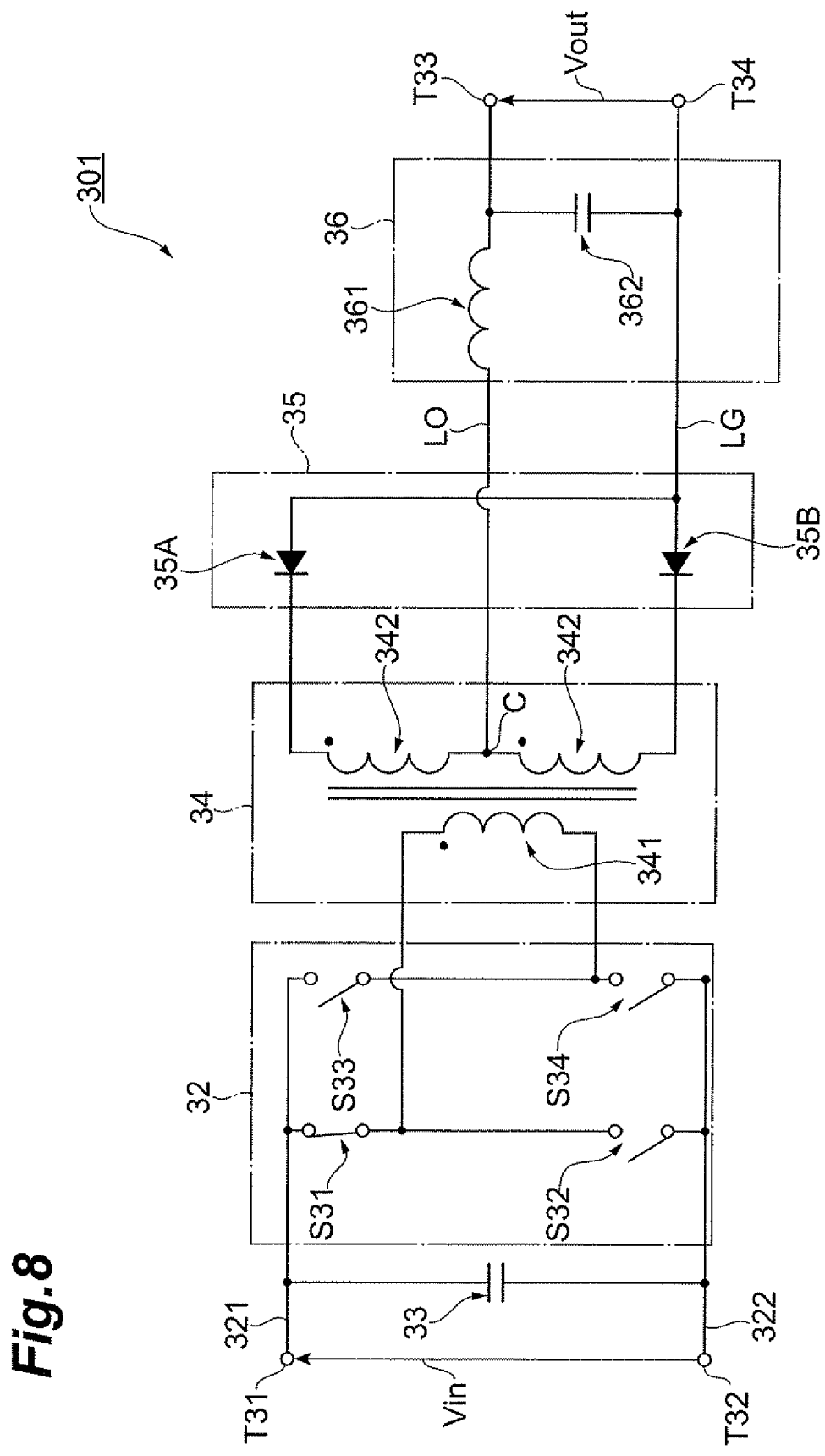
FIG. 8 is a circuit diagram of the switching power supply in accordance with a second embodiment of the present invention.

FIG. 8 is a circuit diagram of the switching power supply in accordance with the second embodiment of the present invention. As illustrated in FIG. 8, the switching power supply 301 in accordance with this embodiment, which functions as a DC to DC converter, converts a higher DC input voltage Vin supplied from a higher voltage battery or the like into a lower DC output voltage Vout and feeds the latter to a lower voltage battery or the like.

The switching power supply 301 comprises a switching circuit 32 and an input smoothing capacitor 33 which are disposed between a primary higher voltage line 321 and a primary lower voltage line 322, a transformer 34 having primary and secondary transformer coil parts 341, 342, a rectifier circuit 35 connected to the secondary transformer coil part 342, and a smoothing circuit 36 connected to the rectifier circuit 35.

The switching circuit 32 has a full-bridge circuit structure constituted by switching devices S31 to S34. In response to a driving signal supplied from a driving circuit (not shown), for example, the switching circuit 32 converts the DC input voltage Vin applied between input terminals T31, T32 into an input AC voltage.

The input smoothing capacitor 33 smoothens the DC input voltage Vin fed from the input terminals T31, T32. The transformer 34 transforms the input AC voltage generated by the switching circuit 32 and outputs the resulting AC voltage. The turn ratio between the primary and secondary transformer coil parts 341, 342 is appropriately set according to a voltage transformation ratio. Here, the number of turns in the primary transformer coil part 341 is made greater than that of the secondary transformer coil part 342. The secondary transformer coil part 342, which is of a center tap type, is guided to an output terminal T33 through a junction C and an output line LO.

The rectifier circuit 35 is of a single-phase full-wave rectification type constituted by rectifier diodes 35A, 35B. Each of the rectifier diodes 35A, 35B has a cathode connected to the secondary transformer coil part 342 and an anode connected to a grounding line LG led to an output terminal T34. As a consequence, the rectifier circuit 35 individually rectifies half wave periods of the output AC voltage from the transformer 34, so as to generate a DC voltage.

The smoothing circuit 36 includes a choke coil 361 and an output smoothing capacitor 362. The choke coil 361 is inserted in the output line LO. The output smoothing capacitor 362 is connected between the choke coil 361 in the output line LO and the grounding line LG. As a consequence, the smoothing circuit 36 smoothens the DC voltage rectified by the rectifier circuit 35, so as to generate the DC output voltage Vout, and feeds the latter to a lower voltage battery or the like from the output terminals T33, T34.

In thus constructed switching power supply 301, the DC input voltage Yin supplied from the input terminals T31, T32 is subjected to switching, so as to generate an input AC voltage, which is then fed to the primary transformer coil part 341 of the transformer 34. Thus generated input AC voltage is transformed into an output AC voltage, which is then issued from the secondary transformer coil part 342. The output AC voltage is rectified by the rectifier circuit 35 and smoothened by the smoothing circuit 36, so as to be issued as a DC output voltage Vout from the output terminals T33, T34.

A substrate holding structure for holding coil substrates in the switching power supply 301 will now be explained.

Figure 9:
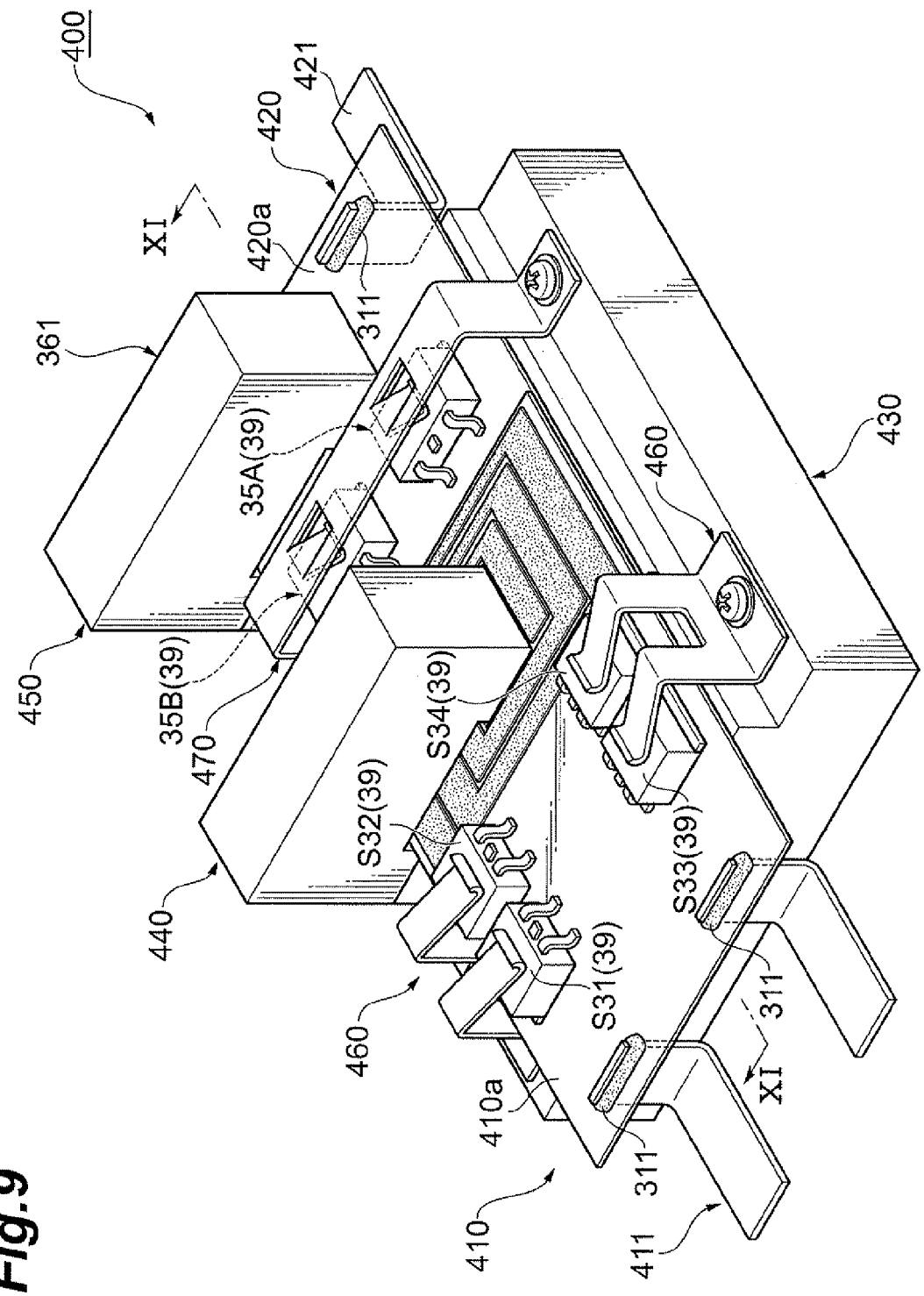
FIG. 9 is a perspective view illustrating a main part of a substrate holding structure in the switching power supply of FIG. 8.
Figure 10:
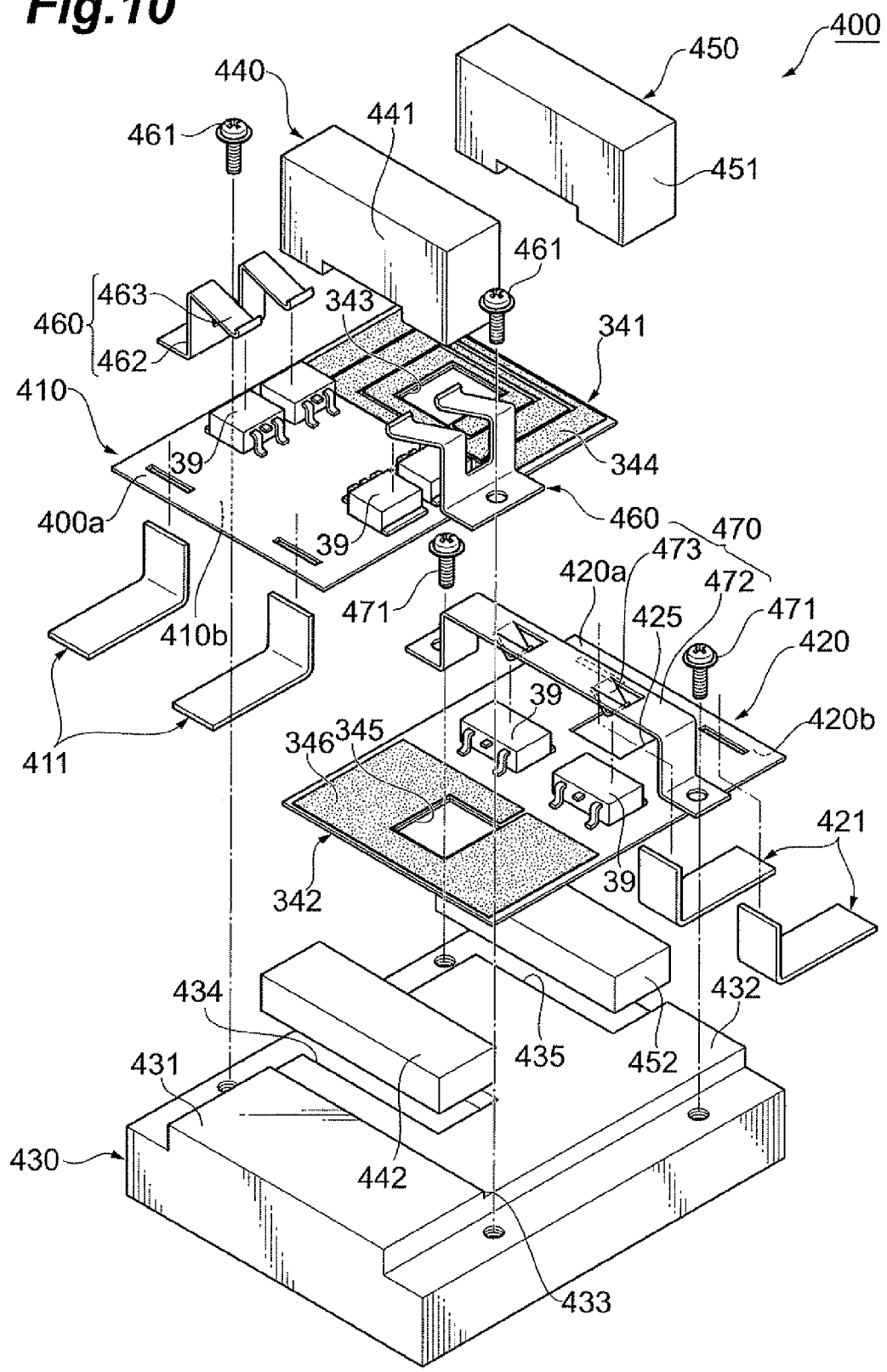
FIG. 10 is an exploded perspective view of the substrate holding structure of FIG. 9.

FIG. 9 is a perspective view illustrating the substrate holding structure in the switching power supply of FIG. 8, while FIG. 10 is an exploded perspective view of the substrate holding structure in FIG. 9. As illustrated in FIGS. 9 and 10, the substrate holding structure 400 of this embodiment comprises first and second coil substrates (circuit substrates) 410, 420 which are disposed on (overlapped with) each other while being shifted from each other, a heatsink (heat dissipating member) 430 as a chassis, a transformer core (through member) 440, a choke core (through member) 450, and first and second spring supports (pressing members) 460, 470.

As illustrated in FIG. 10, the first and second coil substrates 410, 420 are elongated planar printed boards which constitute the above-mentioned circuit of the switching power supply 301.

The first coil substrate 410 has through terminals 411, 411 disposed so as to penetrate therethrough at one end part in the longitudinal direction of the first coil substrate 410 (hereinafter simply referred to as "longitudinal direction"). The through terminals 411, 411 constitute the input terminals T31, T32 and are secured and electrically connected to pads (not depicted) on the upper face 410a of the first coil substrate 410 with solder 311 (see FIG. 9).

On the first coil substrate 410, the primary transformer coil part 341 is disposed over an area extending from substantially the center to the other end in its longitudinal direction when seen in the substrate thickness direction (laminating direction; from the upper face 410a side). The primary transformer coil part 341 has a longitudinal width narrower than a width in the lateral direction of the first coil substrate 410 (hereinafter simply referred to as "lateral direction") when seen in the substrate thickness direction.

At substantially the center position of the primary transformer coil part 341, a rectangular through hole 343 is formed as one through which the transformer core 440 is inserted.

The primary transformer coil part 341 includes a conductor pattern 344, formed from copper or the like, for example, extending like a rectangular spiral about the through hole 343.

The second coil substrate 420 has through terminals 421, 421 disposed so as to penetrate therethrough at its other longitudinal end part. The through terminals 421, 421 constitute the output terminals T33, T34 and are secured and electrically connected to pads (not depicted) on the upper face 420a of the second coil substrate 420 with solder 311 (see FIG. 9).

On the second coil substrate 420, the secondary transformer coil part 342 is disposed over an area extending from one end to substantially the center in its longitudinal direction when seen in the substrate thickness direction. The secondary transformer coil part 342 has a longitudinal width narrower than a lateral width when seen in the substrate thickness direction as with the primary transformer coil part 341.

At substantially the center position of the secondary transformer coil part 342, a rectangular through hole 345 is formed as one through which the transformer core 440 is inserted. The secondary transformer coil part 342 includes a conductor pattern 346, formed from copper or the like, for example, extending like a rectangular spiral about the through hole 345. At the other longitudinal end part of the second coil substrate 420, a rectangular through hole 425 is formed as one through which the choke core 450 is inserted.

The first and second coil substrates 410, 420 are disposed on each other while being shifted from each other in the longitudinal direction such that only the primary and secondary transformer coil parts 341, 342 overlap each other as seen in the substrate thickness direction (i.e., only the primary and secondary transformer coil parts 41, 42 become a multilayer area) and that the through holes 343, 345 communicate with each other. Here, the second coil substrate 420 is disposed on the heatsink 430 side (lower side).

On the upper faces 410a, 420a of the first and second coil substrates 410, 420, areas other than the multilayer area are employed as mounting areas mounted with components 39 such as semiconductor components. Specifically, as illustrated in FIG. 9, the switching devices S31 to S34 are mounted on the mounting area of the first coil substrate 410, while the rectifier diodes 35A, 35B are mounted on the mounting area of the second coil substrate 420.

Examples of the switching devices include metal-oxide-semiconductor field-effect transistors (MOS-FET) and insulated gate bipolar transistors (IGBT).

Returning to FIG. 10, the heatsink 430 is one for dissipating the heat of the first and second coil substrates 410, 420 and releasing the heat of the mounted components 39 through the first and second coil substrates 410, 420. The heatsink 430 is formed from aluminum, for example, and has a coefficient of thermal conductivity higher than that of the first and second coil substrates 410, 420.

The heatsink 430 has a heat dissipating surface 431 for abutting against the lower face (second main face) 410b of the first coil substrate 410 and a heat dissipating surface 432 for abutting against the lower face (second main face) 420b of the second coil substrate 420. The heat dissipating surfaces 431, 432 are constructed such as to continue with each other through a step 433 having a height equal to the thickness of the second coil substrate 420.

The heat dissipating surface 432 is formed with depressions 434, 435. The depression 434 is depressed in conformity to the form of the transformer core 440 in order to catch the latter. The depression 435 is depressed in conformity to the form of the choke core 450 in order to catch the latter.

In the heatsink 430, the first and second coil substrates 410, 420 are mounted on the respective heat dissipating surfaces 431, 432. Hence, the lower faces 410b, 420b of the first and second coil substrates 410, 420 abut against the heatsink 430 as illustrated in FIG. 11.

As illustrated in FIG. 10, the transformer core 440, which is used for magnetically connecting the primary and secondary transformer coil parts 341, 342 to each other, is a circuit component constituting the transformer 34. The transformer core 440 is formed from a magnetic material such as ferrite, for example.

The transformer core 440 has an annular form with a rectangular cross section. Specifically, the transformer core 440 includes an upper core 441 which is a so-called U-shaped core and a lower core 442 which is a so-called I-shaped core, while they are joined and secured to each other by a securing member which is not shown.

Figure 11:
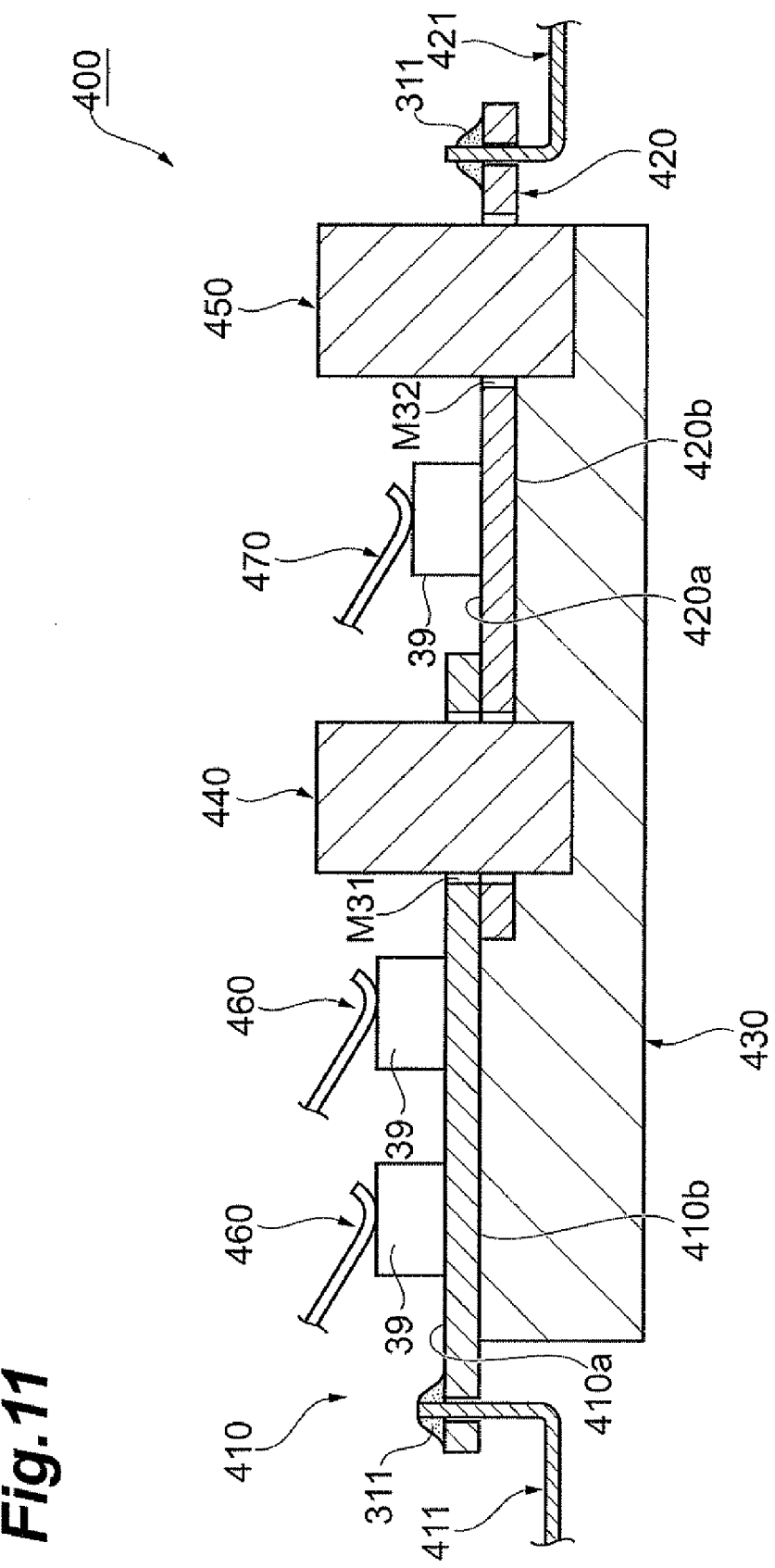
FIG. 11 is a schematic view of a cross section taken along the line XI-XI of FIG. 9.

In this transformer core 440, the upper core 441 is inserted (in a so-called free-fitting manner) in the through holes 343, 345 with a predetermined amount of gap M31 (see FIG. 11). That is, the transformer core 440 is disposed so as to penetrate through the first and second coil substrates 410, 420 with a predetermined amount of gap M31.

Also, in the transformer core 440, the lower core 442 fits into and engages the depression 434 of the heatsink 432, while the upper core 441 and lower core 442 are joined to each other. Thus constructed transformer core 440 inhibits the first and second coil substrates 410, 420 from shifting in longitudinal and lateral directions which are their main face directions. The predetermined amount of gap M31 is appropriately set according to coefficients of thermal expansion of the first and second coil substrates 410, 420, for example.

The choke core 450 is a circuit component corresponding to the choke coil 361 and is formed from a magnetic material such as ferrite, for example. The choke core 450 has an annular form with a rectangular cross section. Specifically, the choke core 450 includes an upper core 451 which is a so-called U-shaped core and a lower core 452 which is a so-called I-shaped core, while they are joined and secured to each other by a securing member which is not shown.

In this choke core 450, the upper core 451 is inserted (in a so-called free-fitting manner) in the through hole 425 with a predetermined amount of gap M32 (see FIG. 11). That is, the choke core 450 is disposed so as to penetrate through the second coil substrate 420 with a predetermined amount of gap M32.

Also, in the choke core 450, the lower core 452 fits into and engages the depression 435 of the heatsink 432, while the upper core 451 and lower core 452 are joined to each other. Thus constructed choke core 450 inhibits the first and second coil substrates 410, 420 from shifting in longitudinal and lateral directions which are their main face directions. The predetermined amount of gap M32 is appropriately set according to the coefficient of thermal expansion of the second coil substrate 420, for example.

The first and second spring supports 460, 470 are used for pressing the mounted components 39 to the heatsink 430 and have a folded-plate structure using a metal sheet, for example. Each first spring support 460 has a support part 462 secured to the heatsink 430 with a screw 461 and leaf spring parts 463 continuing with the leading end side of the support part 462. The first spring support 460 urges the switching devices S31 to S34 to the heatsink 430 with a predetermined urging force (elastic force) by bringing its leaf spring parts 463 into contact with the upper faces of the switching devices S31 to S34.

The second spring support 470 has an arch-shaped support part 472 which is secured to the heatsink 430 with a screw 471 and laterally bridges over the second coil substrate 420, and disc spring parts 473 which are disposed in the support part 472 and bulge downward. The second spring support 470 urges the rectifier diodes 35A, 35B to the heatsink 430 with a predetermined urging force (elastic force) by bringing its disc spring parts 473 into contact with the upper faces of the rectifier diodes 35A, 35B.

As in the foregoing, the first and second spring supports 460, 470 press the mounted components 39 in this embodiment as illustrated in FIG. 11. Hence, the mounted components 39 are pressed against the first and second coil substrates 410, 420, which are pressed against the heatsink 430. The transformer core 440 is inserted in the through holes 343, 345, while the choke core 450 is inserted in the through hole 425. Therefore, only the transformer core 440 and choke core 450 inhibit the first and second coil substrates 410, 420 from shifting in the longitudinal and lateral directions. As a consequence, the first and second coil substrates 410, 420 are secured to the heatsink 430 not rigidly but such as to be allowed to shift by a predetermined amount along main face directions. That is, the first and second coil substrates 410, 420 are secured to the heatsink 430 such as to be movable by a predetermined amount in main face directions.

This can release stresses such as thermal stresses generated in the first and second coil substrates 410, 420 and prevent warpage, flexure, and distortion from occurring therein. This makes it possible to enhance the adhesion between the mounted components 39 and the first and second coil substrates 410, 420, and reliably hold the first and second coil substrates 410, 420 while increasing the adhesion between the first and second coil substrates 410, 420 and the heatsink 430.

Figure 13:
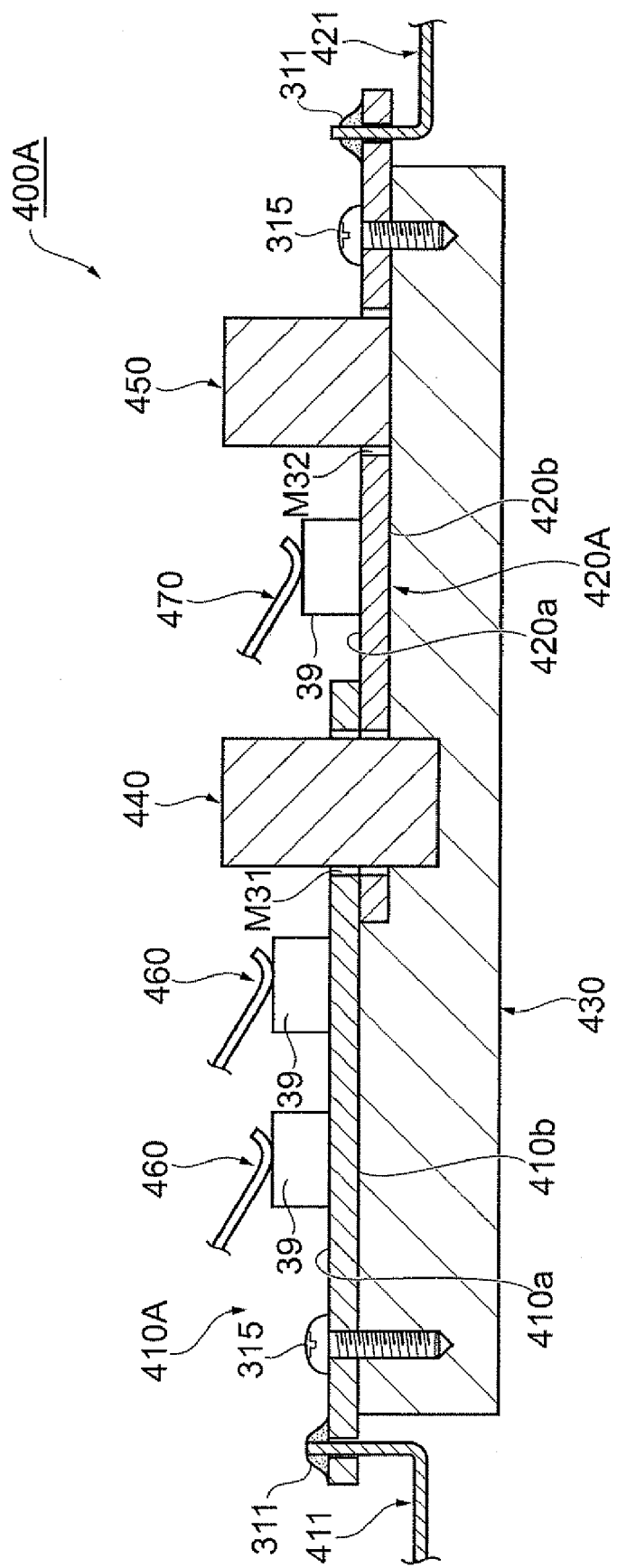
FIG. 13 is a schematic view, corresponding to FIG. 11, of a conventional substrate holding structure.

Since the transformer core 440 and choke core 450 constitute the above-mentioned circuit, it is unnecessary to provide screws 315 separately as fastening devices as in a conventional substrate holding structure 400A illustrated in FIG. 13, for example, at the time of securing the first and second coil substrates 410, 420. Further, there is less necessity for securing an insulation distance or arranging an insulating component between the transformer core 440 and choke core 450 and the mounted components 39. This can also restrain the mounting area from decreasing when holding the first and second coil substrates 410, 420.

That is, this embodiment can improve the adhesion between the first and second coil substrates 410, 420 and the heatsink 430 while securing the mounting area. The following effects are also exhibited since a predetermined amount of shift is allowed between the first and second coil substrates, 410, 420 and the heatsink 430 as mentioned above. That is, it can mitigate stresses in the first and second coil substrates 410, 420 caused by vibrations and the like from the outside. It can further mitigate thermal stresses, generated by differences in thermal expansion, causing the first and second coil substrates 410, 420 to warp and flex. The above-mentioned effect of mitigating thermal stresses is remarkable in particular in the switching power supply 301 since, during its operation, the first and second coil substrates 410, 420 are likely to raise their temperature because of the heat from the power semiconductor devices such as switching devices S31 to S34 and rectifier diodes 35A, 35B, the transformer 34, and the choke coil 361.

When the first and second coil substrates 410, 420 are allowed to shift and release their stresses as in this embodiment, thermal stresses, vibrations, and the like occurring in the first and second coil substrates 410, 420, if any, can be prevented from applying forces onto the solder 311 and damaging the same. As a result, electric connections can be secured in the substrate holding structure 400, and its reliability can be improved.

As mentioned above, the first and second coil substrates 410, 420 of this embodiment are disposed on each other while being shifted from each other such that the primary and secondary transformer coil parts 341, 342 overlap each other as seen in the substrate thickness direction. This can increase the outer surface area of the first and second coil substrates 410, 420, i.e., heat dissipation area, and enhance heat dissipation as compared with one in which the first and second coil substrates 410, 420 are superposed on each other.

In this embodiment, the first and second coil substrates 410, 420 are mounted on the heatsink 430, and the adhesion between the first and second coil substrates 410, 420 and the heatsink 430 is enhanced as mentioned above. Therefore, the heat of the mounted components 39 can be transferred more to the heatsink 430 through the first and second coil substrates 410, 420. Hence, this embodiment can further enhance the heat dissipation.

Since the transformer core 440 and choke core 450 constitute the above-mentioned circuit as explained above, the first and second coil substrates 410A, 420A can be made smaller than in the case where they are secured with screws, pins, and the like separately provided as conventionally done (see FIG. 13), whereby the number of components and cost can be kept from increasing. If end parts of the first and second coil substrates 410, 420 are secured with screws, their center parts will be likely to lower the adhesion in particular because of warpage of the first and second coil substrates 410, 420. In this embodiment, by contrast, the adhesion is high in the center parts as well.

Since both the through holes 343, 345 and transformer core 440 are rectangular in this embodiment, inserting the transformer core 440 into the through holes 343, 345 regulates shifts not only in the longitudinal direction as a first main face direction but also in the lateral direction as a second main face direction orthogonal to the first main face direction. Hence, the first and second coil substrates 410, 420 are inhibited from rotationally shifting as well. The same holds for the through hole 425 with the choke core 450.

Though a preferred embodiment of the present invention is explained in the foregoing, the present invention is not limited thereto.

Figure 12:
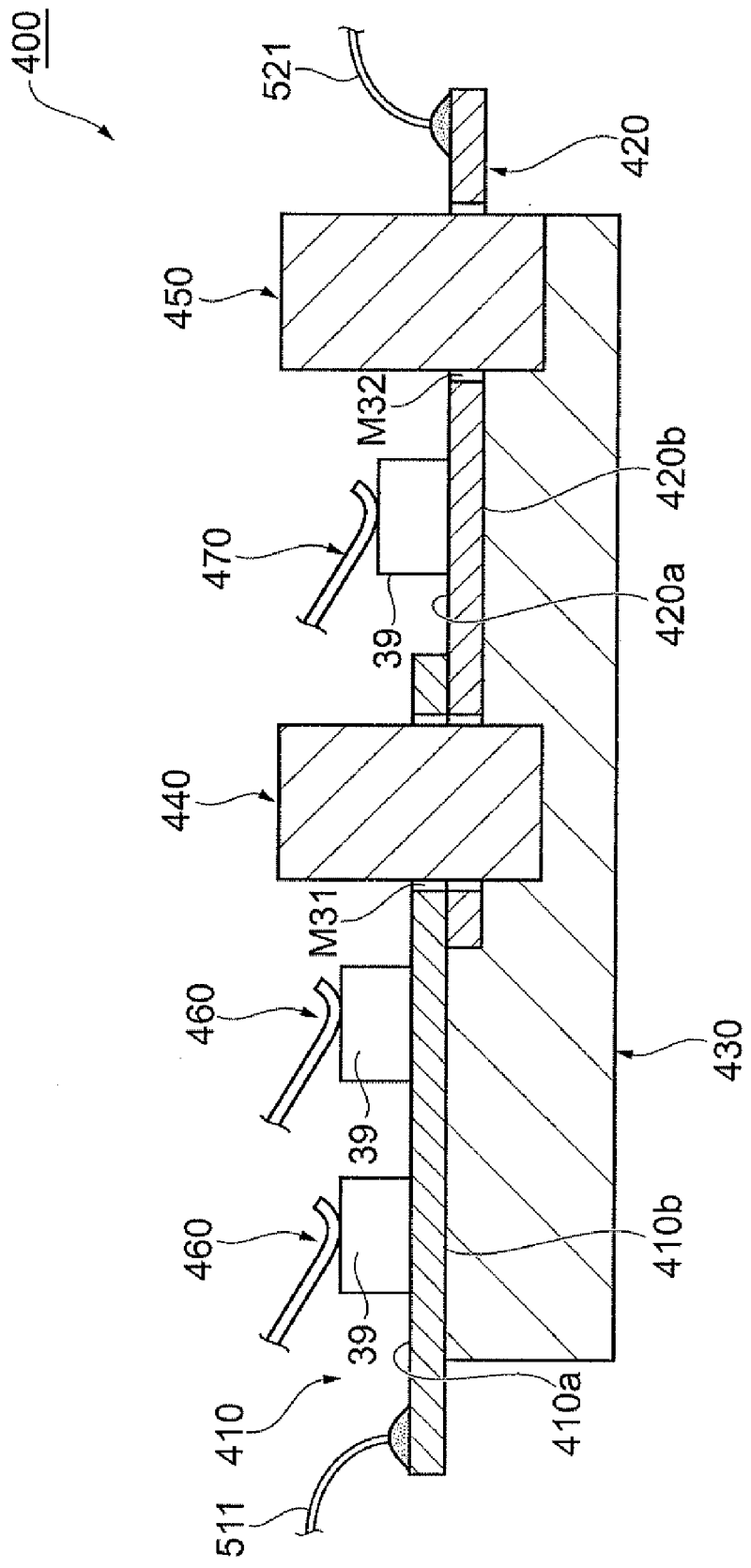
FIG. 12 is a schematic view, corresponding to FIG. 11, of the substrate holding structure in accordance with a modified example.

For example, while the above-mentioned embodiment uses the through terminals 411, 421 (see FIG. 11) as those constituting the input terminals T31 to T34, bonding wires 511, 521 may be bonded onto pads (not depicted) on the upper faces 410a, 420a as illustrated in FIG. 12.

Though the first and second spring supports 460, 470 as pressing members urge the mounted components 39 with urging forces in order to further enhance the adhesion between the first and second coil substrates 410, 420 and the heatsink 430 in the above-mentioned embodiment, the pressing members may press the mounted components without urging forces.

Though the above-mentioned embodiment comprises the first and second coil substrates 410, 420 as circuit substrates, the number of circuit substrates may be 1 or 3 or more. Though the heatsink 430 is provided as a chassis, the chassis may have a box form and the like without being restricted to plates.

Though the transformer core 440 and choke core 450 in the above-mentioned embodiment use U-shaped cores as the upper cores 441, 451 and I-shaped cores as the lower cores 442, 452, E-shaped cores may be used as the upper cores, while I- or E-shaped cores may be used as the lower cores.

Though the transformer core 440 and choke core 450 constitute through members in the above-mentioned embodiment, one of them may constitute a through member alone. The through members are not limited to them, but may be circuit components such as through terminals, for example.

The switching power supply 301 may be an AC to DC converter or the like without being restricted to the above-mentioned DC to DC converter. An adhesive made of an elastic resin or the like may be applied between the first and second coil substrates 410, 420 and the heatsink 430, so as to elastically bond them together.

The above-mentioned circuit of the switching power supply 301 is of a common-anode center tap type in the above-mentioned embodiment, but may be a common-cathode center tap type, for example. The height of the step 433 is equal to the thickness of the second coil substrate 420 in the above-mentioned embodiment, but may be greater (thicker) than the latter. The first and second coil substrates 410, 420 may have widths different from each other.

While power semiconductor devices such as the switching devices S31 to S34 and rectifier diodes 35A, 35B are surface-mounted as the mounted components 39 on the upper faces 410a, 420a of the first and second coil substrates 410, 420 in the above-mentioned embodiment, surface-mount passive devices such as coils and capacitors, for example, may be surface-mounted together with the power semiconductor devices. In this case, it will be sufficient if at least parts of the lower faces 410b, 420b of the first and second coil substrates 410, 420 corresponding to the parts mounted with the power semiconductor devices abut against the heatsink 430.

The gap M31 may be formed between at least a part of the periphery of the transformer core 440, instead of the whole periphery thereof, and the first and second coil substrates 410, 420 (e.g., the transformer core 440 may be shifted in one main face direction within the through holes 343, 345) as long as it can allow the first and second coil substrates to shift. The same holds for the gap M32 with respect to the choke core 450.

The present invention may also be constructed such as to combine the first and second embodiments together. That is, the present invention may be a coil substrate structure including a first coil substrate constituting a predetermined circuit and having a primary transformer coil part and a second coil substrate, disposed on the first coil substrate, constituting the predetermined circuit and having a secondary transformer coil part; the coil substrate structure comprising a chassis mounted with the first and second coil substrates, a component mounted on the first and second coil substrates, a pressing member for pressing the mounted component to the chassis, and a through member constituting the predetermined circuit and engaging the chassis while penetrating through the first and second coil substrates; wherein the first and second coil substrates are inhibited from shifting along a main face thereof by the through member alone; wherein the primary and secondary transformer coil parts include a spirally extending conductor pattern as seen in a substrate thickness direction; wherein the first and second coil substrates are disposed on each other while being shifted from each other such that the primary and secondary transformer coil parts overlap each other as seen in the substrate thickness direction; and wherein the primary and secondary transformer coil parts have a width in a predetermined direction narrower than a width in a direction intersecting the predetermined direction as seen in the substrate thickness direction. The present invention may also be a switching power supply equipped with this coil substrate structure.

The present invention can enhance the heat dissipation and fully secure the mounting area. The present invention can also improve the adhesion between the circuit substrate and chassis while securing the mounting area.

What is claimed is:

1. A coil substrate structure comprising:
   a first coil substrate having a primary transformer coil part; and
   a second coil substrate, disposed on the first coil substrate, having a secondary transformer coil part, the coil substrate structure transmitting electric power from the first coil substrate side to the second coil substrate side;
   wherein the primary and secondary transformer coil parts include a spirally extending conductor pattern as seen in a substrate thickness direction;
   wherein the first and second coil substrates are disposed on each other while being shifted from each other such that the primary and secondary transformer coil parts overlap each other as seen in the substrate thickness direction;
   wherein the primary and secondary transformer coil parts have a width in a predetermined direction narrower than a width in a direction intersecting the predetermined direction as seen in the substrate thickness direction;
   wherein the predetermined direction is a direction extending along the electric power transmitting direction;
   wherein the first and second coil substrates have an elongated planar form and are disposed on each other while being longitudinally shifted from each other; and
   wherein the primary and secondary transformer coil parts have a width in a longitudinal direction as the predetermined direction narrower than a width in a lateral direction as the intersecting direction as seen in the substrate thickness direction.

2. A coil substrate structure according to claim 1, wherein the conductor pattern has a conductor width in the predetermined direction narrower than that in the intersecting direction.

3. A coil substrate structure according to claim 1, wherein the first and second coil substrates have a first main face mounted with a component and a second main face, opposite to the first main face, in contact with a heat dissipating member.

4. A coil substrate structure according to claim 3, wherein the first and second coil substrates are disposed on each other such that one having a higher amount of heat generation is positioned closer to the heat dissipating member.

5. A coil substrate structure according to claim 1, further comprising a transformer core for magnetically connecting the primary and secondary transformer coil parts to each other;
   wherein each of the primary and secondary transformer coil parts is formed with a through hole for inserting the transformer core; and
   wherein the conductor pattern extends spirally about the through hole.

6. A switching power supply comprising the coil substrate structure according to claim 1.

7. A substrate holding structure, equipped with a circuit substrate constituting a predetermined circuit, for holding the circuit substrate, the substrate holding structure comprising:
   a chassis mounted with the circuit substrate;
   a component mounted to the circuit substrate;
   a pressing member for pressing the mounted component to the chassis; and a through member constituting the predetermined circuit and contacting the chassis while penetrating through the circuit substrate;

wherein the circuit substrate is inhibited from shifting along a main face thereof by the through member alone.

8. A substrate holding structure according to claim 7, wherein the through member penetrates through the circuit substrate with a predetermined amount of gap.

9. A substrate holding structure according to claim 7, wherein the circuit substrate comprises a first coil substrate having a primary transformer coil part and a second coil substrate, disposed on the first coil substrate, having a secondary transformer coil part, and wherein the through member is a transformer core for magnetically connecting the primary and secondary transformer coil parts to each other.

10. A substrate holding structure according to claim 9, wherein the first and second coil substrates are disposed on each other while being shifted from each other such that the primary and secondary transformer coil parts overlap each other as seen in the substrate thickness direction.

11. A substrate holding structure according to claim 7, wherein the chassis is a heat dissipating member for dissipating heat from the circuit substrate.

12. A switching power supply comprising the substrate holding structure according to claim 7.

13. A coil substrate structure including a first coil substrate constituting a predetermined circuit and having a primary transformer coil part and a second coil substrate, disposed on the first coil substrate, constituting the predetermined circuit and having a secondary transformer coil part, the coil substrate structure comprising:

a chassis mounted with the first and second coil substrates;

a component mounted on the first and second coil substrates;

a pressing member for pressing the mounted component to the chassis; and a through member constituting the predetermined circuit and engaging the chassis while penetrating through the first and second coil substrates;

wherein the first and second coil substrates are inhibited from shifting along a main face thereof by the through member alone;

wherein the primary and secondary transformer coil parts include a spirally extending conductor pattern as seen in a substrate thickness direction;

wherein the first and second coil substrates are disposed on each other while being shifted from each other such that the primary and secondary transformer coil parts overlap each other as seen in the substrate thickness direction;

wherein the primary and secondary transformer coil parts have a width in a predetermined direction narrower than a width in a direction intersecting the predetermined direction as seen in the substrate thickness direction; and wherein the predetermined direction is parallel to a direction in which electric power is transmitted from the first coil substrate to the second coil substrate.

14. A switching power supply comprising the coil substrate structure according to claim 13.

\* \* \* \* \*